United States Patent [19]
Corbin, Jr. et al.

[11] Patent Number: 5,713,690
[45] Date of Patent: Feb. 3, 1998

[54] APPARATUS FOR ATTACHING HEATSINKS

[75] Inventors: John Saunders Corbin, Jr., Austin; Ciro Neal Ramirez, Round Rock, both of Tex.

[73] Assignee: International Business Machines Corporation, Armonk, N.Y.

[21] Appl. No.: 653,893

[22] Filed: May 28, 1996

[51] Int. Cl.⁶ .................................................. H05K 7/20
[52] U.S. Cl. .......................... 403/270; 403/265; 174/16.3; 361/704; 361/713
[58] Field of Search .......................... 174/16.3; 165/185; 361/713, 710, 709, 704; 363/141, 144; 257/675, 707, 717; 403/270, 268, 265

[56] References Cited

U.S. PATENT DOCUMENTS

| | | | |
|---|---|---|---|
| 2,935,666 | 5/1960 | Van Namen | 174/16.3 X |
| 3,182,115 | 5/1965 | Moran et al. | 174/16.3 |
| 3,229,756 | 1/1966 | Keresztury | 174/16.3 X |
| 4,167,031 | 9/1979 | Patel | 174/16.3 X |
| 4,563,725 | 1/1986 | Kirby | 361/388 |
| 4,682,651 | 7/1987 | Gabuzda | 165/80.3 |
| 4,739,447 | 4/1988 | Lecomte | 361/386 |
| 4,748,495 | 5/1988 | Kucharek | 357/82 |
| 4,753,290 | 6/1988 | Gabuzda | 165/185 |
| 5,055,909 | 10/1991 | Culver | 357/81 |
| 5,222,014 | 6/1993 | Lin | 361/414 |
| 5,379,185 | 1/1995 | Griffin et al. | 361/709 |
| 5,423,375 | 6/1995 | Chiou | 174/16.3 X |

*Primary Examiner*—Anthony Knight
*Attorney, Agent, or Firm*—Richard A. Henkler

[57] ABSTRACT

A method and apparatus for attaching heatsinks having a disproportional size relative to the electronic component to which they are attached. In general, the apparatus comprises variable-length attaching means for attaching each corner of the heatsink to the circuit card while maintaining sufficient contact with the electronic component. The variable-length attaching means includes a post and a receiving well. Both the post and receiving well include attaching means, such as threads and nuts, for attachment to the heatsink and circuit board, respectively. The variable-length attaching means accommodates height variations between parts, establishes high structural integrity after assembly, controls static and dynamic loading of the solder columns, allows for module re-work while re-using the heatsink and card, and provides adequate protection from shock, vibration, and handling.

5 Claims, 4 Drawing Sheets

APPARATUS FOR ATTACHING HEATSINKS

BACKGROUND

1. Field of the Present Invention

The present invention generally relates to heatsinks, and more specifically, to apparatuses for attaching the heatsinks to an electronic module such as an integrated circuit.

2. History of Related Art

The appetite of the consumer for processing intensive applications, such as multimedia, has resulted in the ever increasing demand for computer systems that operate at faster speeds. As certain components of the computer system, such as the microprocessor, operate at these increasing speeds, they generate excess heat which must be dissipated by some means.

The dissipation is typically accomplished via some heat conducting medium such as air or liquid. The use of an air cooling medium, however, is highly preferable over a liquid, primarily, because of the expense and complexity usually associated with the implementation of such a liquid dissipation system. The use of the air medium is accomplished via heatsinks.

Components that require high power dissipation will typically require a heatsink that is proportional to these dissipation requirements. In other words, as the heat dissipation requirements increase, the size of the heatsink increases as well. The size and weight of the heatsink is often on the magnitude of 10 times that of the component requiring the dissipation.

Conventionally, heatsink attachment is accomplished by (1) attaching the heatsink directly to the module via a thermal adhesive, spring clip, etc..; or (2) elastically attaching the heatsink to the card via a spring clip, or the like, while pre-loading the heatsink against the module. When an electronic module, such as a microprocessor, is surface mounted to a circuit board via solder balls, solder columns, or the like, the conventional methods for attaching a large heatsink can be defective. More specifically, the conventional methods can be inadequate for resisting shock and vibration, such as those encountered during handling and shipping of the computer system.

One method for resolving the above noted shock and vibration problems attaches the heatsink directly to the card, or a stiffening structure on the card, and thus strain relieves the module. The use of this method, however, creates several additional problems arising from the requirement that intimate contact be maintained between the heatsink and the component for adequate thermal performance. This intimate contact is further complicated when solder columns, solder balls, or the like, are used to surface mount the module to the card. The complication arises from the poor tolerance control over the height of the module above the card surface for such mounting techniques, as well as others.

It would, therefore, be a distinct advantage to have an apparatus for mounting a heatsink to a component that would (1) accommodate height variations between parts; (2) establish high structural integrity after assembly; (3) control static and dynamic loading of the solder columns (or other fragile elements of the module); (4) allow for module rework while re-using the heatsink and card; and (5) provide a means to easily and inexpensively ground the heatsink to suppress coupled electromagnetic emissions from the module. The present invention provides such an apparatus.

SUMMARY OF THE PRESENT INVENTION

In one aspect, the present invention is an apparatus for attaching a heatsink to an electronic module mounted on a circuit card. The apparatus includes a plurality of posts each having means for attaching to the heatsink, and an end portion. The apparatus further includes a plurality of wells each having means for attaching to the circuit card, and means for receiving a corresponding one of the end portions. The apparatus also includes retaining means for retaining each one of the end portions in a corresponding one of the wells.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF A PREFERRED EMBODIMENT OF THE PRESENT INVENTION

Figure 1:
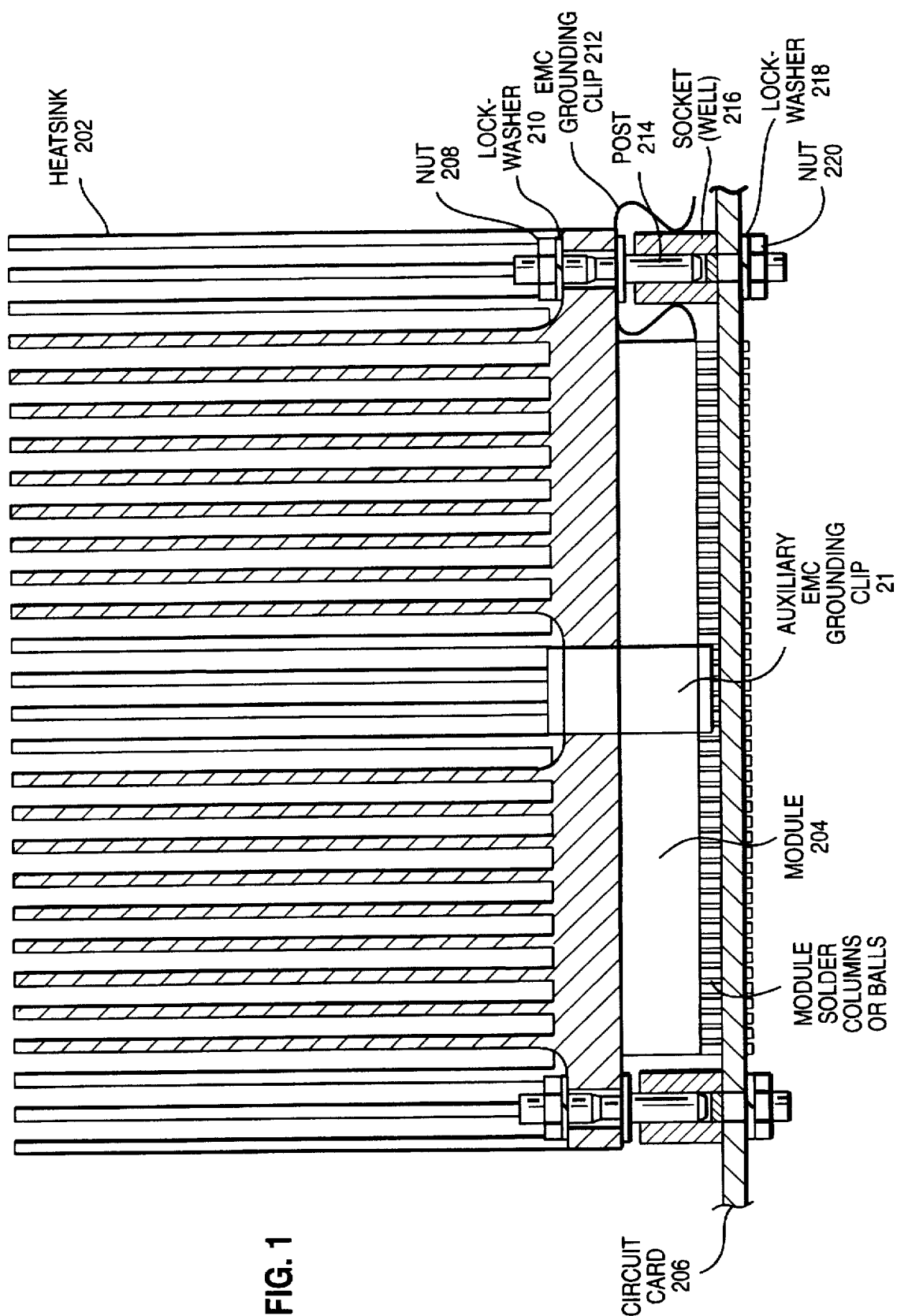
FIG. 1 is a plan view of a heatsink mounted to an electronic module according to the teachings of the present invention.

Reference now being made to FIG. 1, a plan view of a heatsink 202 mounted to a module 204 is shown according to the teachings of the present invention. In general, each corner of the heatsink 202 is mounted to the circuit board 206 using what are referred to hereinafter as variable-length mounting posts. Each variable-length mounting post comprises a post and a socket (well), such as post 214 and well 216. A more detailed description of the use of post 214 and well 216 is made in connection with the description of FIG. 2.

Figure 2:
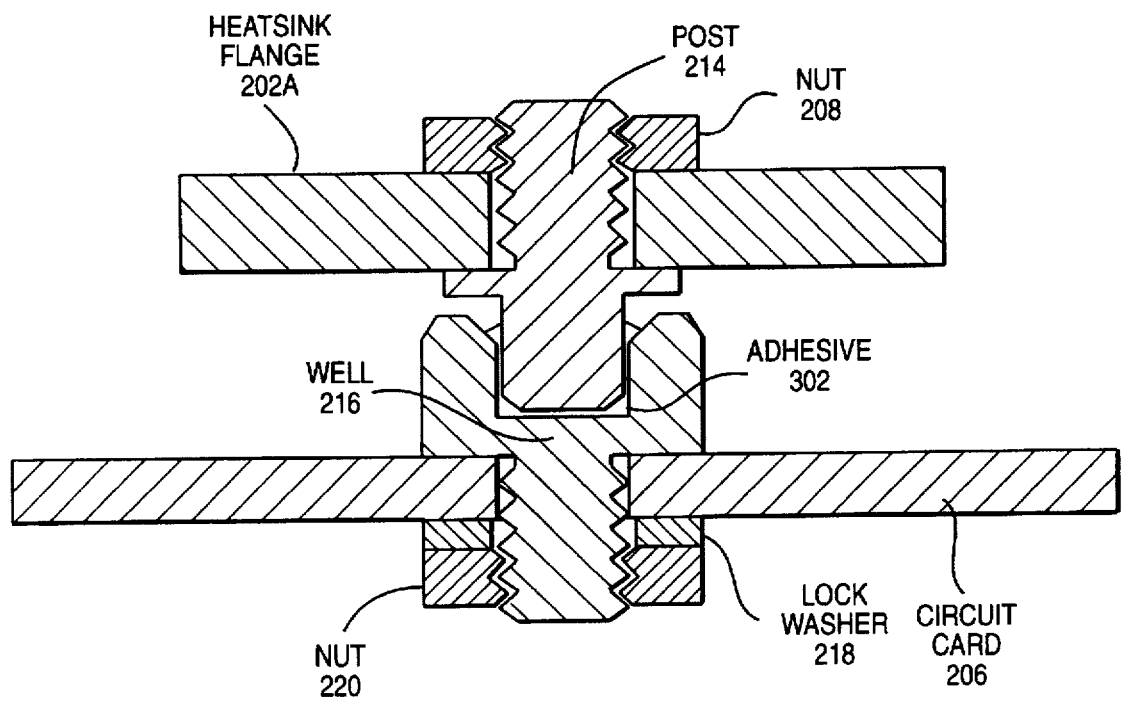
FIG. 2 is a cross sectional view of one corner of the heatsink of FIG. 1 according to the teachings of the present invention.

Reference now being made to FIG. 2, a cross sectional view of one corner of the heatsink 202 of FIG. 1 is shown according to the teachings of the present invention. As shown in FIG. 2, post 214 and well 216 are attached to the heatsink 202 and circuit card 206 using a threaded fastener, such as nuts 208 and 220, respectively. Those of ordinary skill in the art will readily recognize that the use of nuts 208 and 220 are not a limitation for such attachments, but in fact, any structurally sound attachment means can be used, such as retaining rings, press fits, clips, or the like.

It should be noted, however, that selection of such attachment means should include the ability to detach the post 214 and well 216 without resulting in damage to the heatsink 202 or circuit card 206, respectively. In addition, the attachment means must also be capable of withstanding the expected shock, vibration, and handling loads without shifting. The attachment of the heatsink 202 is described hereinafter in connection with FIG. 1.

Now referring back to FIG. 1, the heatsink 202 is attached by placing the heatsink 202 over the module 204 so that the post 214 enters the well 216, with cylindrical and axial gaps larger than the required assembly tolerances. It should be noted that while the heatsink 202 is in this position, it rests directly on the module 204, rather than on the posts 214. A thermally conductive material may be introduced between the base of the heatsink 202 and the module 204 cap to promote conduction therebetween. In a preferred embodiment of the present invention an oil film such as PaO100 produced by Mobil Oil Corporation is used as the thermally conductive material.

Upon placement of the heatsink 202 as described above, sufficient force is then applied, via a static weight, spring or other similar means, to the heatsink 202 to pre-load the assembly and establish intimate thermal contact between the heatsink 202 and the module 204, while the circuit card 206 is supported from below in the vicinity of the wells 216. This introduces a modest flexure of the circuit card 206, without damaging the solder columns or other surface mount attachments thereto.

An adhesive 302 (FIG. 2) can be introduced while this force is applied, or alternatively prior to assembly, into the gap of each well 216/post 214 assembly. The adhesive 302 fills the gaps and is allowed to cure, thus, establishing a reliable structure to support the heatsink 202 against forces such as those associated with handling. In a preferred embodiment of the present invention a quick setting single component adhesive, such as the toughened cyanoacrylate class, is used (curing is initiated by surface moisture on the parts being joined). It should be noted, however, that a variety of different adhesives could be used for achieving the same purpose (e.g. epoxies, acrylics, anaerobics).

It should also be noted that other means, such as a set screw (not shown) in the well 216, for providing stability for the post 214 could be used instead.

Grounding of the heatsink 202 for reducing coupled electromagnetic emission purposes is achieved by adding a spring contact clip 212 which is bolted between the post 214 and the heatsink 202, and which bears on the outside of the mating well 216 when the heatsink 202 is assembled. Alternatively, a compliant metallic pad might be positioned in the bottom of the well 216 to provide electrical continuity between the post 214 and the well 216. A conductive (electrically) adhesive or metal set screw could also serve as a grounding path between the post 214 and well 216.

Figure 3:
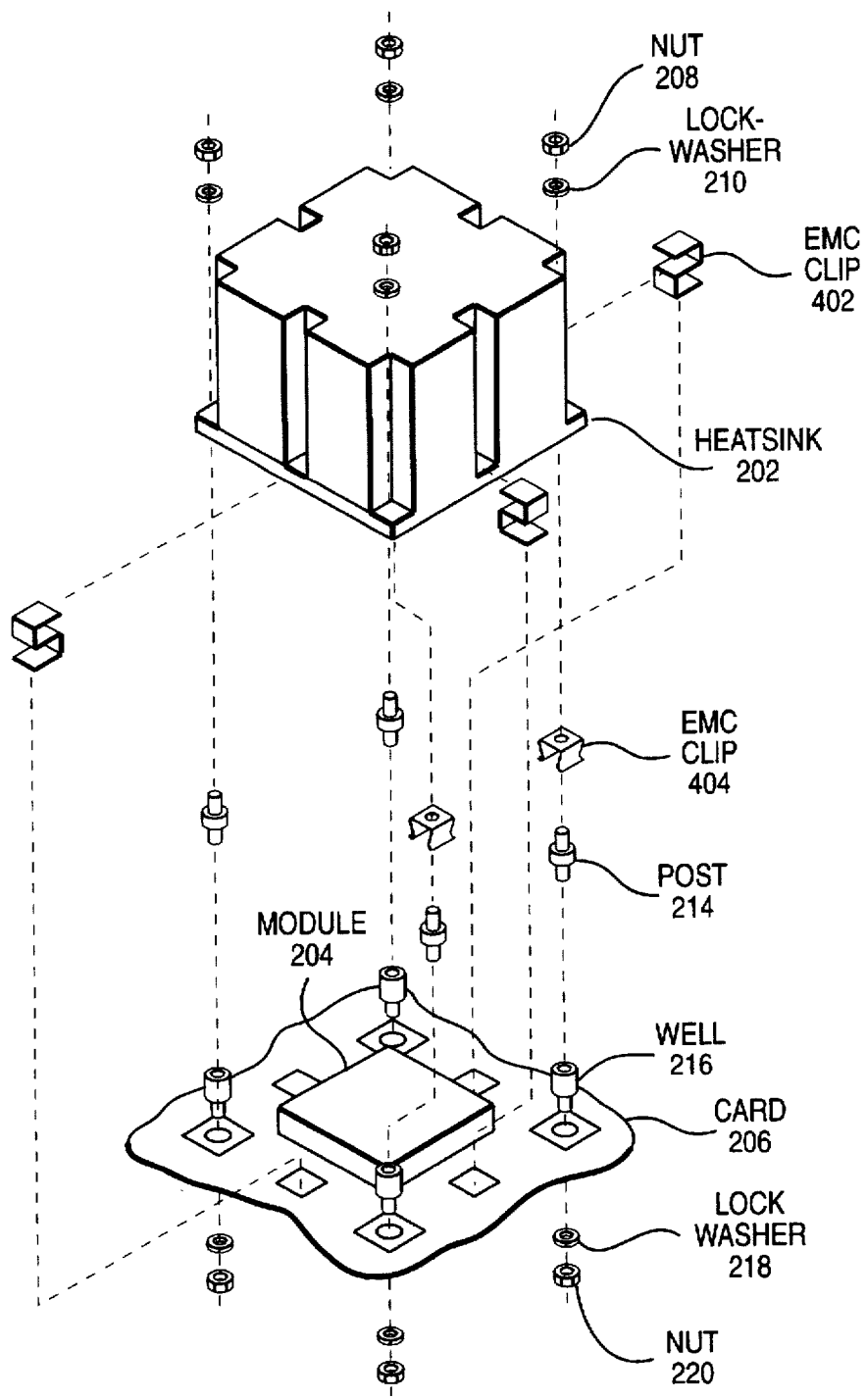
FIG. 3 is an exploded assembly view of the heatsink according to the teachings of the present invention.

Reference now being made to FIG. 3, an exploded assembly view of the heatsink 202 is shown according to the teachings of the present invention. As shown, the heatsink 202 is attached on all four corners as previously explained in connection with FIGS. 1 and 2.

In an alternative embodiment, the above described variable-length posts are combined with a stiffening frame in order to provide additional enhancements as explained below in connection with FIG. 4.

Figure 4:
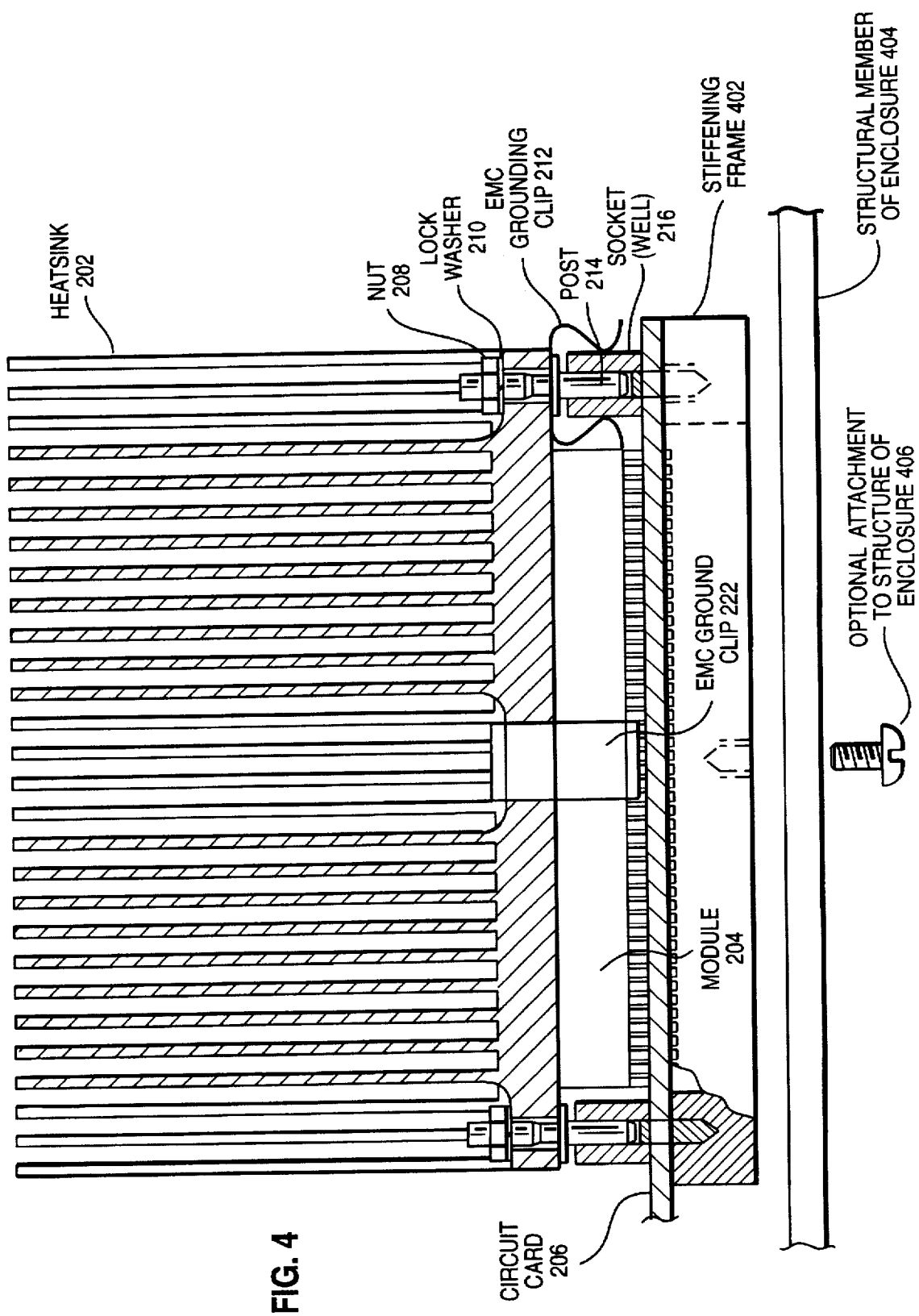
FIG. 4 is a plan view of the heatsink attached to a stiffening frame according to the teachings of the present invention.

Reference now being made FIG. 4, a plan view of the heatsink 202 is shown attached to a stiffening frame 402 according to the teachings of the present invention. As can be seen from FIG. 4, each of the wells 216 are rigidly attached to the stiffening frame 402. The card flexure within the stiffening frame 402 is used to preload the heatsink 202/module 204 assembly. The stiffening frame 402 also further isolates the solder columns or other fragile elements of the module 204 attachment from loads acting on the circuit card 206 or heatsink 202. Additionally, shock loads transmitted into the circuit card 206 are better distributed over the contact area between the circuit card 206 and the stiffening frame 402, thus, reducing any circuit card 206 deformations therefrom. Further, a screw 406 or other similar attachment means may be used to attach the stiffening frame 402 to a structural member of the enclosure 402, thereby further reducing the loads which are transmitted to the circuit card 206.

It should be noted, that the above preferred embodiments allow efficient re-work (re-use) of the assembly by removing all fasteners securing the bounded post 214/well 216 assemblies to the heatsink 202 and circuit card 206, removing the heatsink, and discarding the bonded parts. Because these parts may be inexpensive turned steel parts, the cost of discarding these is small in comparison to the benefit of reusing a very expensive circuit card 206, heatsink 202 and/or module 204.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An apparatus for attaching a heatsink to an electronic module mounted on a circuit card, the apparatus comprising:
   a plurality of posts each including,
      means for attaching to the heatsink, and an end portion;
   a plurality of wells each including,
      means for attaching to the circuit card, and
      means for receiving a corresponding one of the end portions;
   an adhesive for retaining each one of the end portions in a corresponding one of the wells.

2. The apparatus of claim 1, wherein the receiving means is u-shaped.

3. The apparatus of claim 2 wherein the adhesive means is placed within the u-shaped receiving means.

4. The apparatus of claim 3 wherein the means for attaching to the heatsink and means for attaching to the circuit board include a threaded end and a nut.

5. An apparatus for attaching a heatsink to an electronic module mounted on a circuit card, the heatsink and circuit board each having apertures, the apparatus comprising:
   a plurality of posts each including,
      a threaded end for insertion into one of the apertures of the heatsink,
      a flat middle portion for limiting insertion of the threaded end, and
      an end portion;
   a plurality of nuts each one for fastening the threaded end of one of the posts to the heatsink;
   a plurality of wells each including,
      a threaded end for insertion into one of the apertures in the circuit card, and
      a u-shaped portion for receiving and retaining a corresponding one of the end portions, and for limiting the insertion of the threaded end;
   a plurality of nuts each one for fastening the threaded end of one of the wells to the circuit card; and
   an adhesive, placed within the u-shaped portion of each one of the receiving wells, for adhering each one the posts thereto.

* * * * *